(12) United States Patent  
Wang et al.

(10) Patent No.: US 7,833,049 B2  
(45) Date of Patent: Nov. 16, 2010

(54) ELECTRICAL CONNECTOR WITH CHANGEOVER OF CIRCUIT BOARD

(75) Inventors: Chien-Chun Wang, Taoyuan (TW); Shao-Kai Chen, Taoyuan (TW); Chi-Fan Wu, Taoyuan (TW)

(73) Assignee: P-Two Industries, Inc., Taoyuan (TW)

( * ) Notice: Subject to any disclaimer, the term of this patent is extended or adjusted under 35 U.S.C. 154(b) by 0 days.

(21) Appl. No.: 12/542,688

(22) Filed: Aug. 17, 2009

(65) Prior Publication Data

US 2010/0184333 A1 Jul. 22, 2010

(30) Foreign Application Priority Data

| Jan. 21, 2009 | (TW) | ............... 98201273 U |
| Feb. 17, 2009 | (TW) | ............... 98202315 U |
| Apr. 30, 2009 | (TW) | ............... 98207568 U |

(51) Int. Cl.  
 *H01R 12/24* (2006.01)

(52) U.S. Cl. ..................................... 439/497

(58) Field of Classification Search ........... 439/55, 439/59, 62, 497, 579, 493, 660  
See application file for complete search history.

(56) References Cited

U.S. PATENT DOCUMENTS

| 2,932,810 | A | * | 4/1960 | Novak ..................... 439/61 |
| 4,416,496 | A | * | 11/1983 | Brefka ..................... 439/59 |
| 4,595,799 | A | * | 6/1986 | Krob et al. ................ 379/397 |
| 4,767,338 | A | * | 8/1988 | Dennis et al. ............. 439/455 |
| 4,936,785 | A | * | 6/1990 | Krug et al. ................ 439/75 |
| 5,010,446 | A | * | 4/1991 | Scannell ................... 361/749 |
| 5,309,316 | A | * | 5/1994 | Yagi et al. ................. 361/749 |
| 2003/0022558 | A1 | * | 1/2003 | Imaoka ..................... 439/660 |

\* cited by examiner

*Primary Examiner*—Tho D Ta  
(74) *Attorney, Agent, or Firm*—Wang Law Firm; Li K. Wang

(57) ABSTRACT

An electrical connector comprises a circuit board and a first housing, wherein the circuit board has a butt portion and a lap portion, the butt portion is formed thereon with a plurality of first contacts, the lap portion is formed thereon with a plurality of second contacts, the first contacts and the second contacts are connected with each other, the second spacing between the adjacent second contacts is larger than the first spacing between the adjacent first contacts, and the first contacts are arranged to couple to a butt connector. The first housing is assembled on the circuit board and positioned above the lap portion.

18 Claims, 16 Drawing Sheets

ELECTRICAL CONNECTOR WITH CHANGEOVER OF CIRCUIT BOARD

BACKGROUND OF THE INVENTION (a) Field of the Invention

The present invention relates to an electrical connector, and more particularly to an electrical connector which provides a spacing on an insertion/butt end different from the spacing on a wire lap end by the changeover of a circuit board.

(b) Description of the Prior Art

Due to high signal flow between a liquid crystal display and a system host, a low voltage differential signal (LVDS) receiver with an ultra-high speed of 1.4 Gb/s, low power consumption and low electromagnetic radiation is used in a current high-frequency signal transmission system installed between a liquid crystal display interface and a system host board interface, as the signal transmission interface for the liquid crystal display interface. A signal connection is established between the receiver and the signal transmission interface on the system host board interface, i.e. the connector socket on the system host board interface through the connection of a signal transmission line, and a prior LVDS signal transmission system is thus composed.

Generally speaking, a male connector in such prior LVDS signal transmission system has the same spacing on the insertion/butt end as that on the wire lap end. Because the size of an insertion/butt end should match the size of a female socket of a butt connector, the spacing on the insertion/butt and wire lap ends of a male connector become smaller and smaller as the design of the spacing between the socket terminals goes. This often causes poor soldering and short circuits to occur when the wire lap end is securely soldered to the signal transmission line, thus resulting in reducing production yields with increasing production time and costs of LVDS type male connectors.

SUMMARY OF THE INVENTION

In a prior connector, the spacing on the insertion/butt end is the same as that on the wire lap end. This often causes poor soldering and short circuits to occur when the wire lap end is securely soldered to the signal transmission line, thus bringing about the problems of reduced production yields with increased production time and costs of LVDS type male connectors.

The present invention provides an electrical connector comprising a circuit board and a first housing, wherein the circuit board has a butt portion and a lap portion thereon, the butt portion is formed thereon with a plurality of first contacts, the lap portion is formed thereon with a plurality of second contacts, the first contacts and the second contacts are connected with each other, the second spacing between the adjacent second contacts is larger than the first spacing between the adjacent first contacts, and the first contacts are arranged to couple to a butt connector. The first housing is assembled on the circuit board and positioned above the lap portion.

The present invention provides another electrical connector comprising a lower housing, an insulating body, a circuit board and an upper housing. The lower housing has a protruding portion and a bearing portion. The insulating body is disposed on the bearing portion of the lower housing. The circuit board is disposed on the insulating body and the lower housing. The circuit board has a butt portion and a lap portion thereon. The butt portion is disposed on the protruding portion of the lower housing. The lap portion is disposed on the insulating body. The butt portion is formed thereon with a plurality of first contacts. The lap portion is formed thereon with a plurality of second contacts. The first contacts and the second contacts are connected with each other, and the second spacing between the adjacent second contacts is larger than the first spacing between the adjacent first contacts. The first contacts are arranged to couple to a butt connector. The upper housing is positioned above the circuit board.

According to the electrical connector of the present invention, the design of the spacing between the adjacent contacts on the butt portion different from that between the adjacent contacts on the lap portion is used to achieve an object that the spacing between the adjacent contacts on the wire lap end is larger than the spacing between the adjacent contacts on the insertion/butt end. Thus, when signal transmission lines are securely soldered to the wire lap end, the situations of poor soldering and short circuits do not readily occur, and can effectively solve the problems of reduced production yields with increased production time and costs of LVDS type male connectors.

DETAILED DESCRIPTION OF THE PREFERRED EMBODIMENTS

Figure 1:
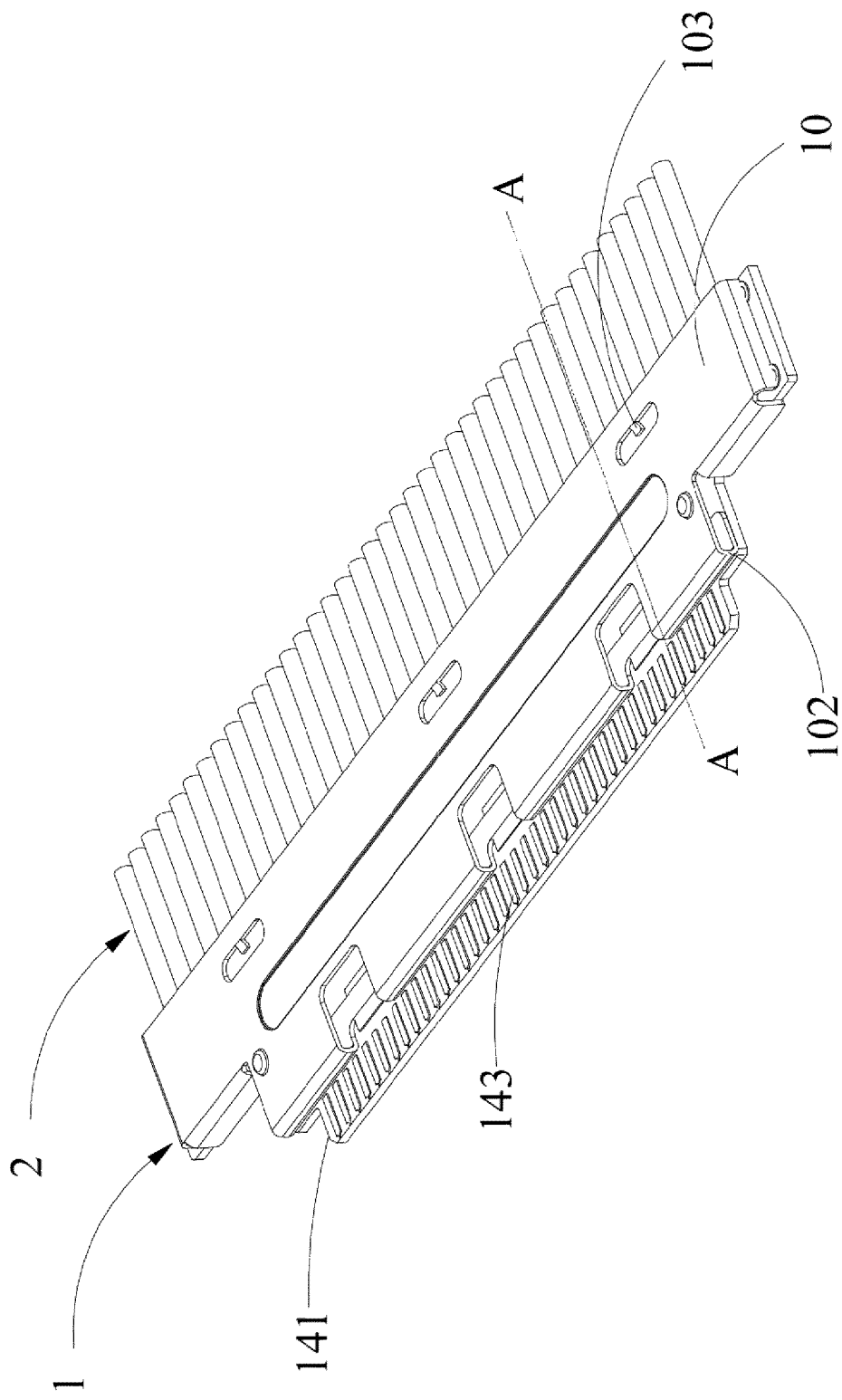
FIG. 1 is a schematic three-dimensional view of the assembly of an electrical connector according to the first embodiment of the present invention.
Figure 2:
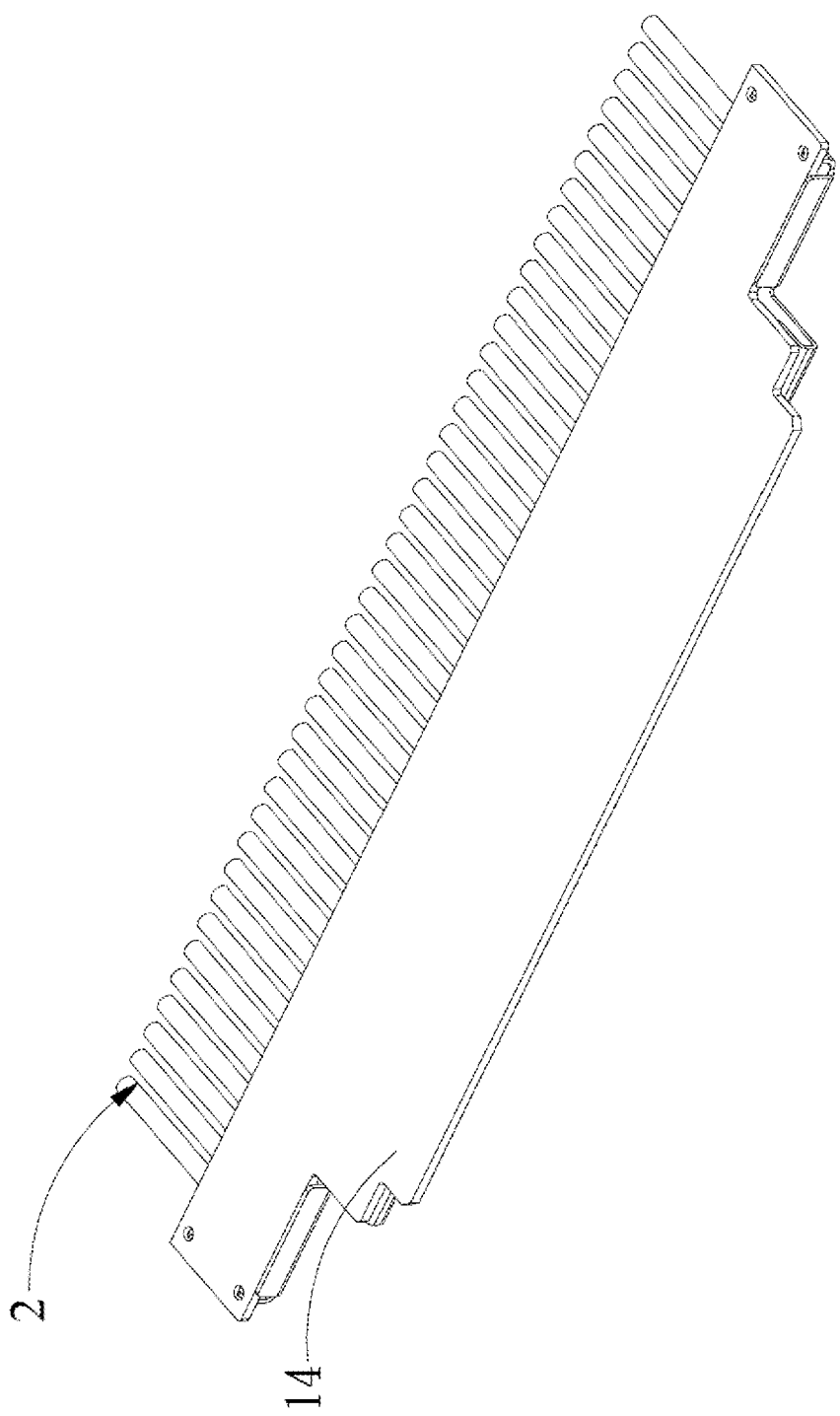
FIG. 2 is a schematic three-dimensional view of the assembly of the electrical connector of FIG. 1, viewed from another direction.
Figure 3:
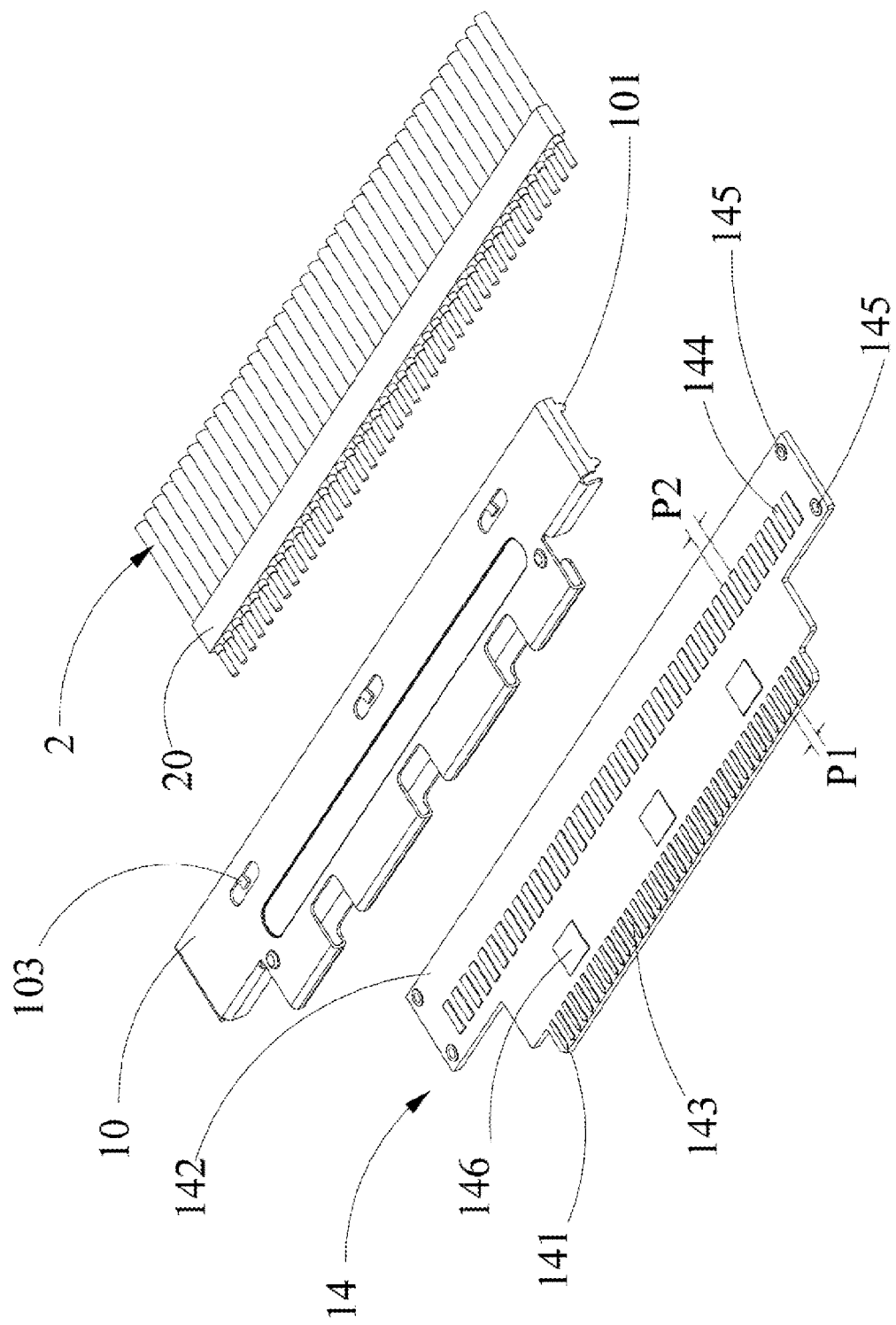
FIG. 3 is a schematic three-dimensional exploded view of the electrical connector of FIG. 1.
Figure 4:
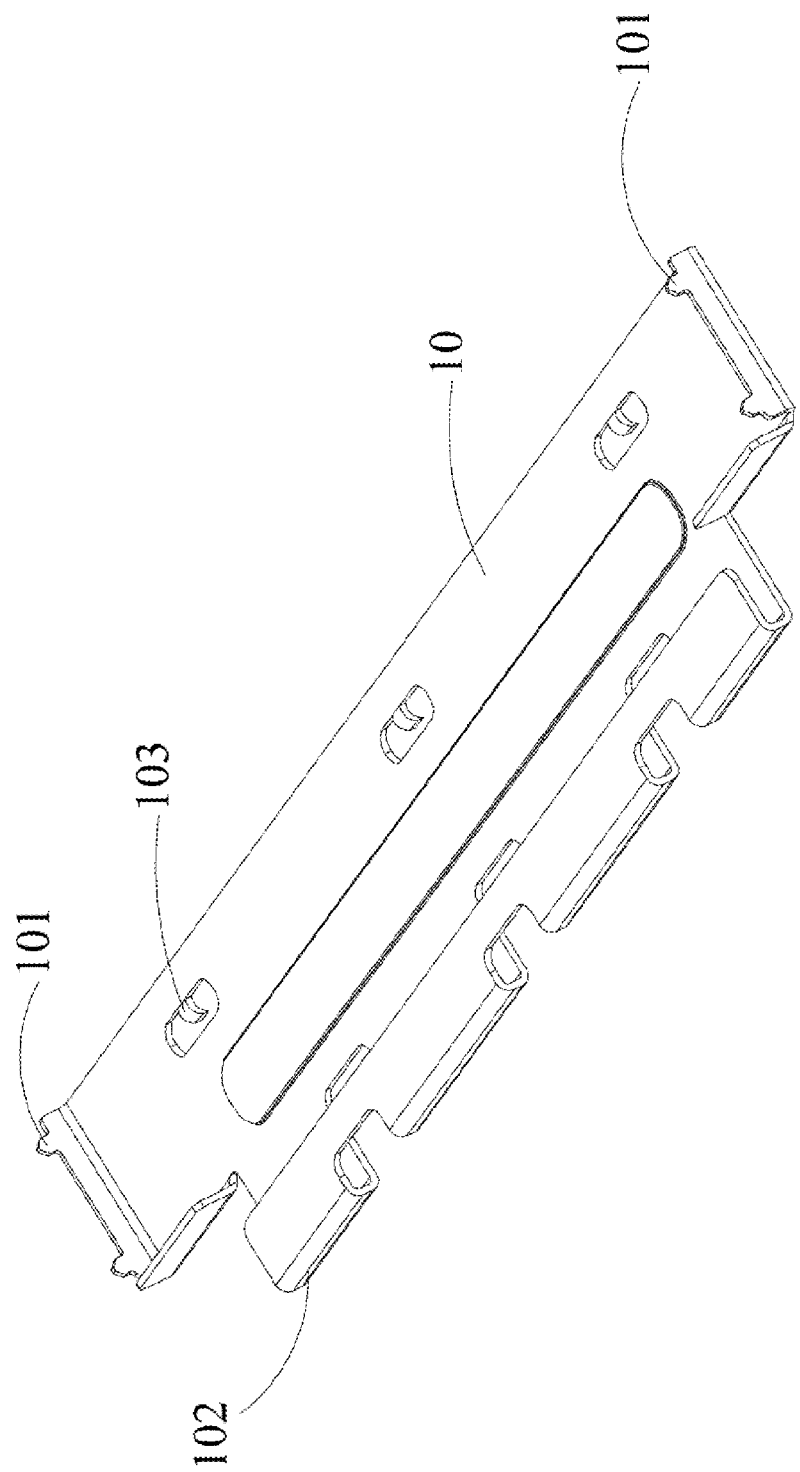
FIG. 4 is a schematic three-dimensional view of a first housing of the electrical connector of FIG. 3.
Figure 5:
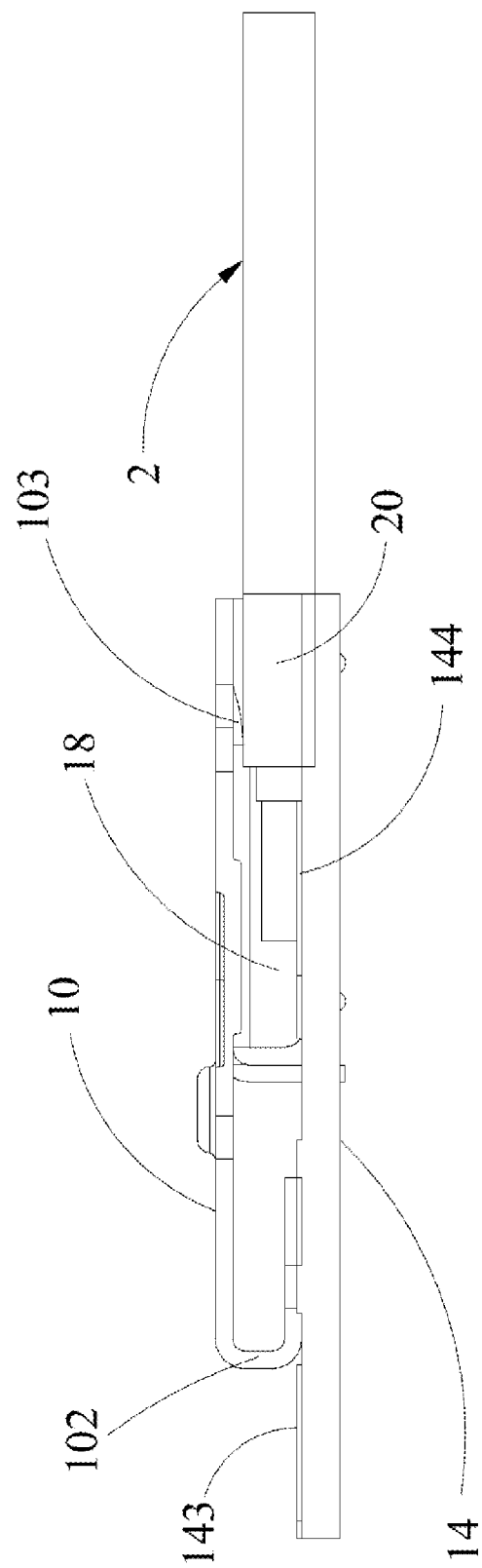
FIG. 5 is a schematic sectional view according to the plane A-A of the electrical connector of FIG. 1.

Referring to FIGS. 1 to 5, the first embodiment of the present invention provides an electrical connector. The electrical connector 1 comprises a first housing 10 and a circuit board 14. The circuit board 14 has a butt portion 141 and a lap portion 142 respectively at the front and rear ends thereof. The butt portion 141 is formed thereon with a plurality of first contacts 143. The lap portion 142 is formed thereon with a plurality of second contacts 144. The first contacts 143 and the second contacts 144 are connected with each other, and the second spacing P2 between the adjacent second contacts 144 is larger than the first spacing P1 between the adjacent first contacts 143. The first contacts 143 are arranged to couple to a butt connector (not shown in drawings). The second contacts 144 are arranged to be coupled to a plurality of conducting wires 2. The first housing 10 is disposed on the circuit board 14 and positioned above the lap portion 142.

In this embodiment, the circuit board 14 is a rigid printed circuit board (PCB), but not limited thereto. Other sheet-like plastic substrates with circuits, in which the circuits are made on plastic substrates by using a laser direct structuring (LDS) process, can be used in the present invention. The thickness of the circuit board 14 is approximately 0.28 mm. The top surface of the circuit board 14 is provided with a plurality of joining sections 146 and a plurality of through holes 145 that pass through from the top surface to the bottom surface of the circuit board 14. The first housing 10 has a support portion 102 and a plurality of engaging portions 101. The support portion 102 is disposed on the circuit board 14 for supporting the first housing 10 and allowing the first housing 10 to be positioned above the circuit board 14. In this embodiment, the support portion 102 is securely soldered to the joining section 146, and the engaging portions 101 securely engage with the through holes 145. Thus, the first housing 10 is firmly disposed on the circuit board 14.

In this embodiment, the clearance between the first housing 10 and the circuit board 14 is provided through L-shaped-like support brackets formed by the support portion 102. The bottom ends of the L-shaped support brackets are welded legs for connecting with the plurality of joining sections 146 on the circuit board 14. The support portion 102 has a support function similar to that of a plastic core, so the use and cost of the plastic core can be saved according to the electrical connector 1 of the present invention. Moreover, in the case where the electrical connector 1 requires a thinner design, namely, a smaller height is required, the electrical connector 1 without the design of supporting plastic cores can further meet the requirements for the request of thinner electrical connector.

A containing space 18 is formed among the circuit board 14, the first housing 10, and the support portion 102. The second contacts 144 are positioned in the containing space 18. The plurality of conducting wires 2 are securely soldered respectively to the second contacts 144 such that the conducting wires 2 are electrically connected to the second contacts 144. One ends of the conducting wires 2 are positioned in the containing space 18. In this embodiment, a ground bar 20 is disposed on the conducting wires 2 to achieve the grounding effect between the conducting wires 2 and the first housing 10. When one ends of the conducting wires 2 are securely soldered to the second contacts 144, the ground bar 20 can just be in contact with the spring sheet 103 of the first housing 10 and positioned within the containing space 18. Subsequently, the spring sheet 103 can be welded to the ground bar 20 by welding. Thus, the conducting wires 2 with a grounding function can be in contact with the first housing 10. It should be noted that the butt portion 141 and the first contacts 143 of the rigid printed circuit board extend out of the first housing 10. Thus, the butt portion 141 and the first contacts 143 of the circuit board 14 can form a butt joint for low voltage differential signaling (LVDS).

In this embodiment, there is no metal housing mounted on the bottom surface of the circuit board 14. But not limited thereto, a second housing can be optionally mounted on the bottom surface of the circuit board 14, or a metal layer (not shown in drawings) is coated on the bottom surface of the circuit board 14. The metal layer extends into the through holes 145 to contact the engaging portions 101. Thus, the effect of protecting against electromagnetic interference (EMI) can be achieved and the design of an iron housing can be eliminated. Furthermore, in order that the circuit board 14 can be more firmly held on the first housing 10, the engaging portions 101 can be securely welded into the through holes 145 by welding.

Alternatively, the circuit board 14 can also be a flexible printed circuit (FPC) board. In order to increase the strength and thickness of the circuit board 14 for connecting to a butt connector, the flexible printed circuit board can be initially disposed on a second housing (not shown in drawings), and then the first housing 10 is securely soldered to the flexible printed circuit board or the first housing 10 is fixed to the second housing, and a latching interference connection can be provided between the second housing and the first housing 10.

Figure 6:
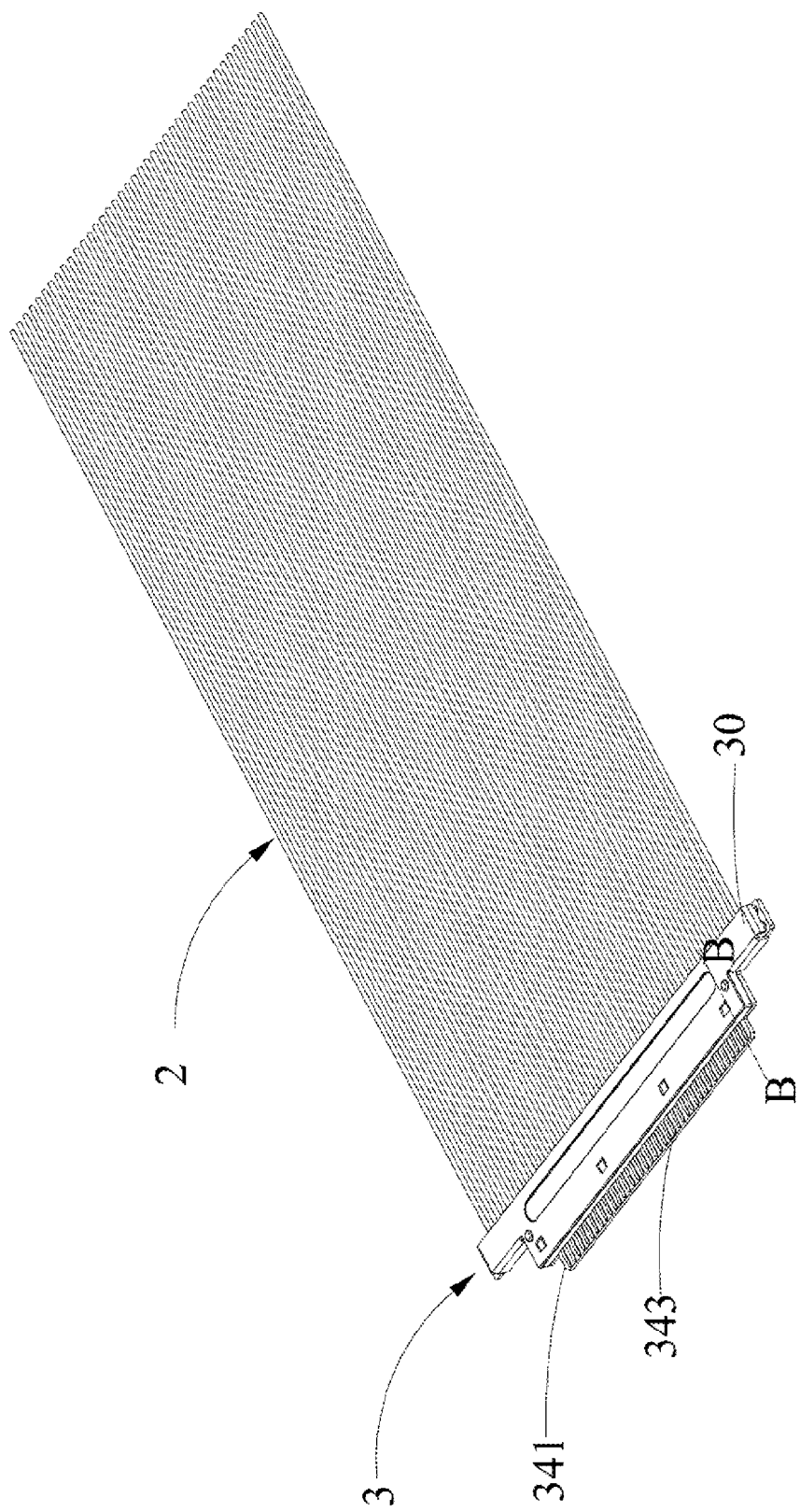
FIG. 6 is a schematic three-dimensional view of the assembly of an electrical connector according to the second embodiment of the present invention.
Figure 7:
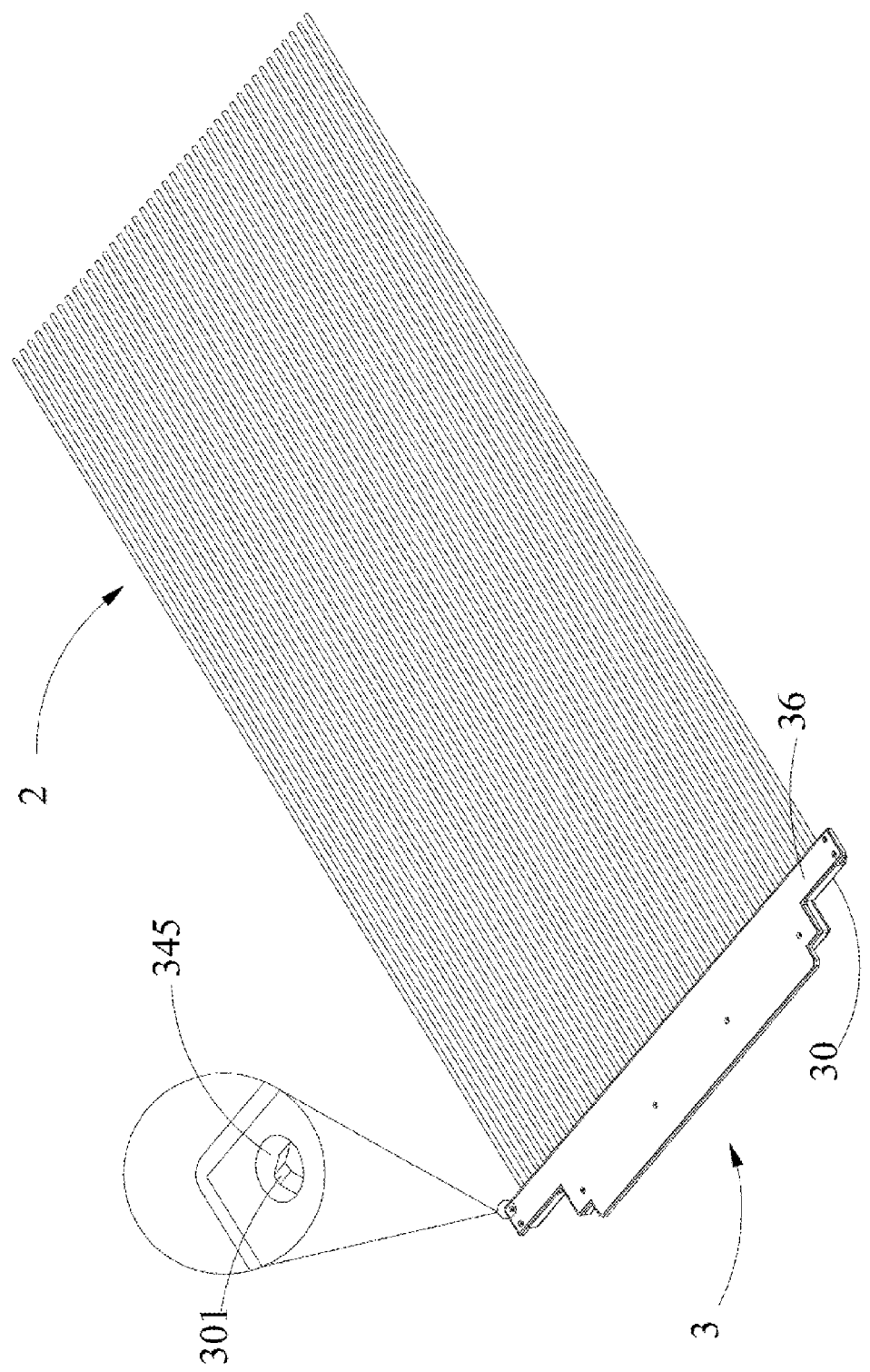
FIG. 7 is a schematic three-dimensional view of the assembly of the electrical connector of FIG. 6, viewed from another direction.
Figure 8:
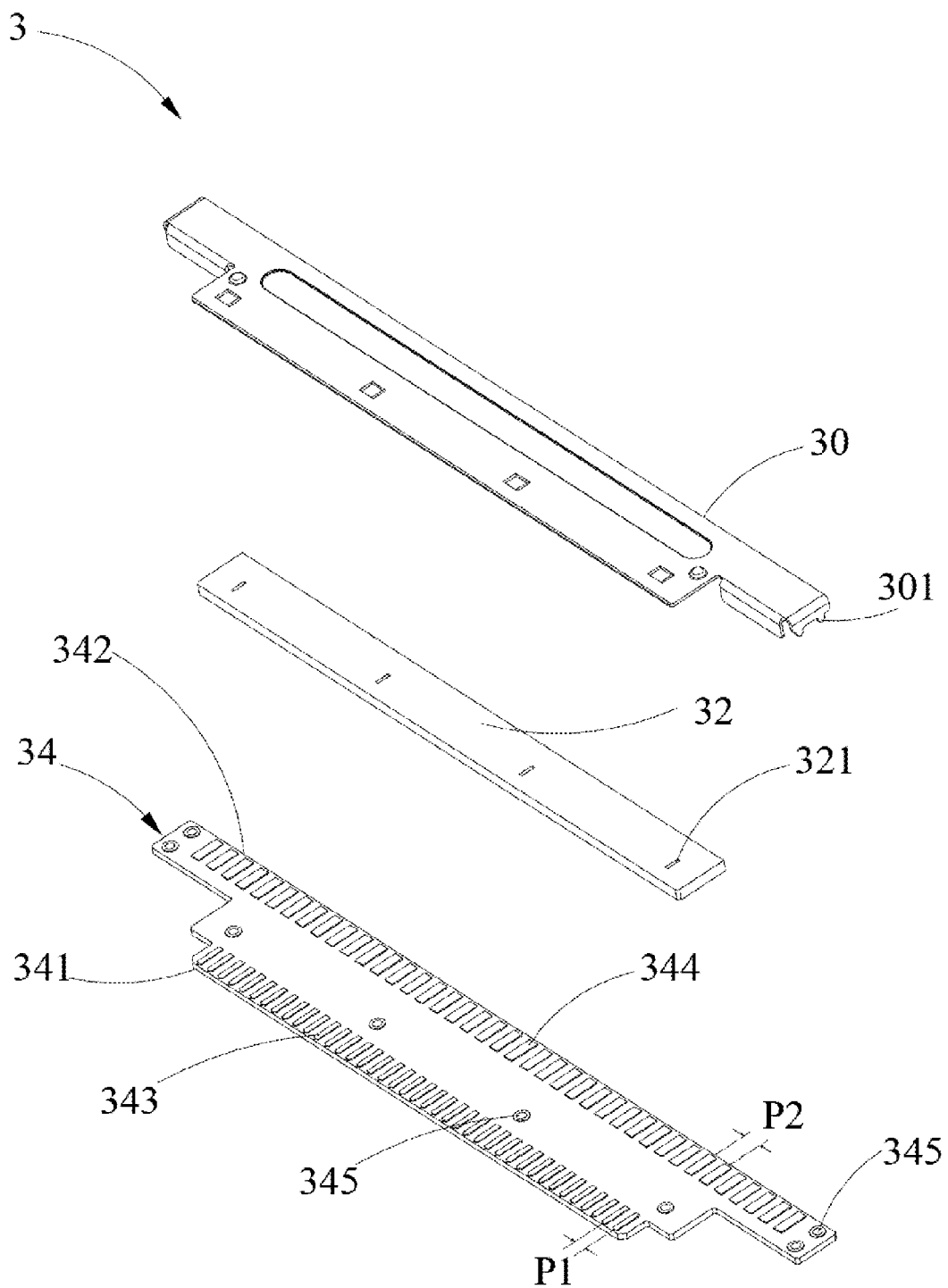
FIG. 8 is a schematic three-dimensional exploded view of the electrical connector of FIG. 6.
Figure 9:
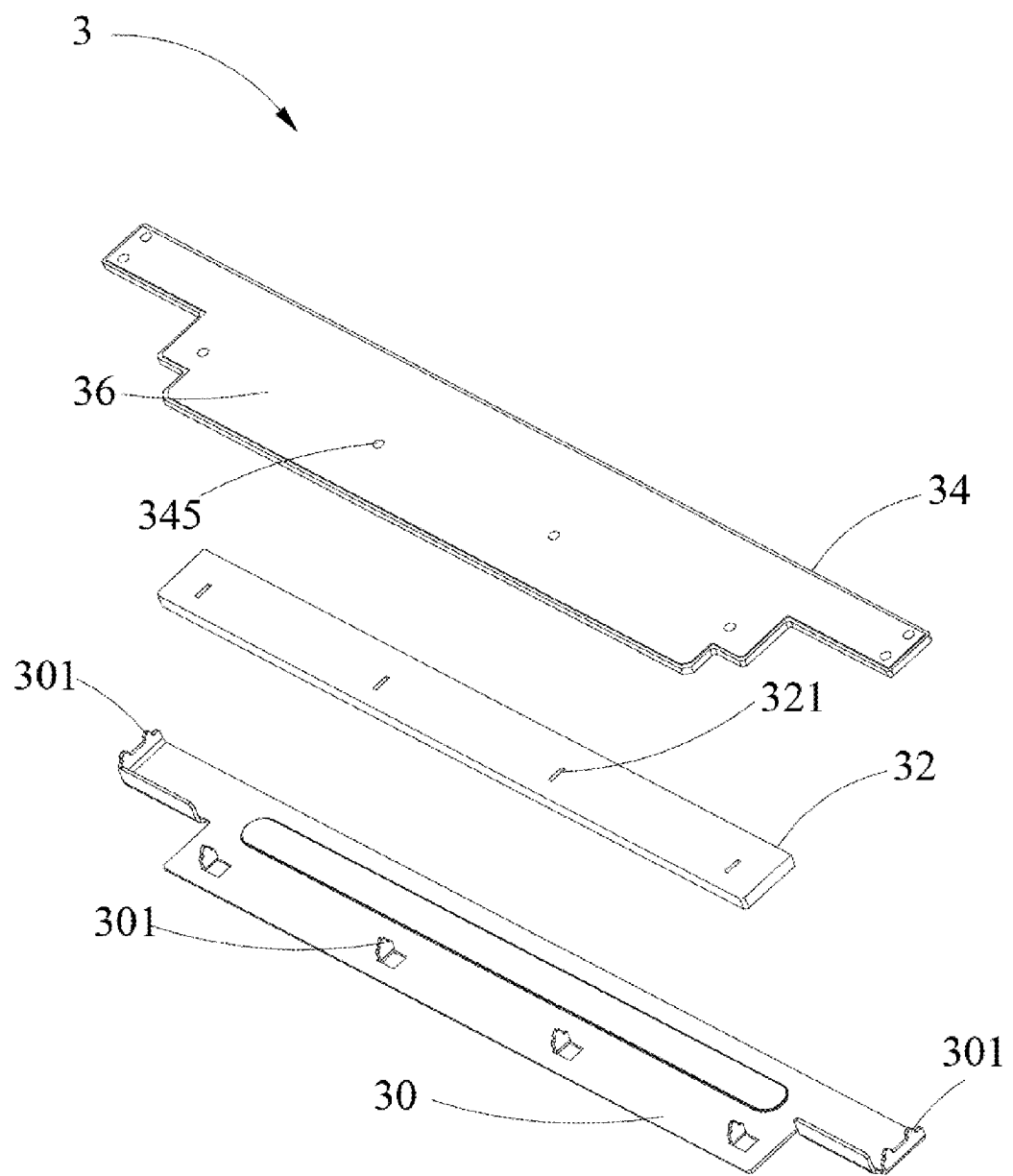
FIG. 9 is a schematic three-dimensional exploded view of the electrical connector of FIG. 6, viewed from another direction.
Figure 10:
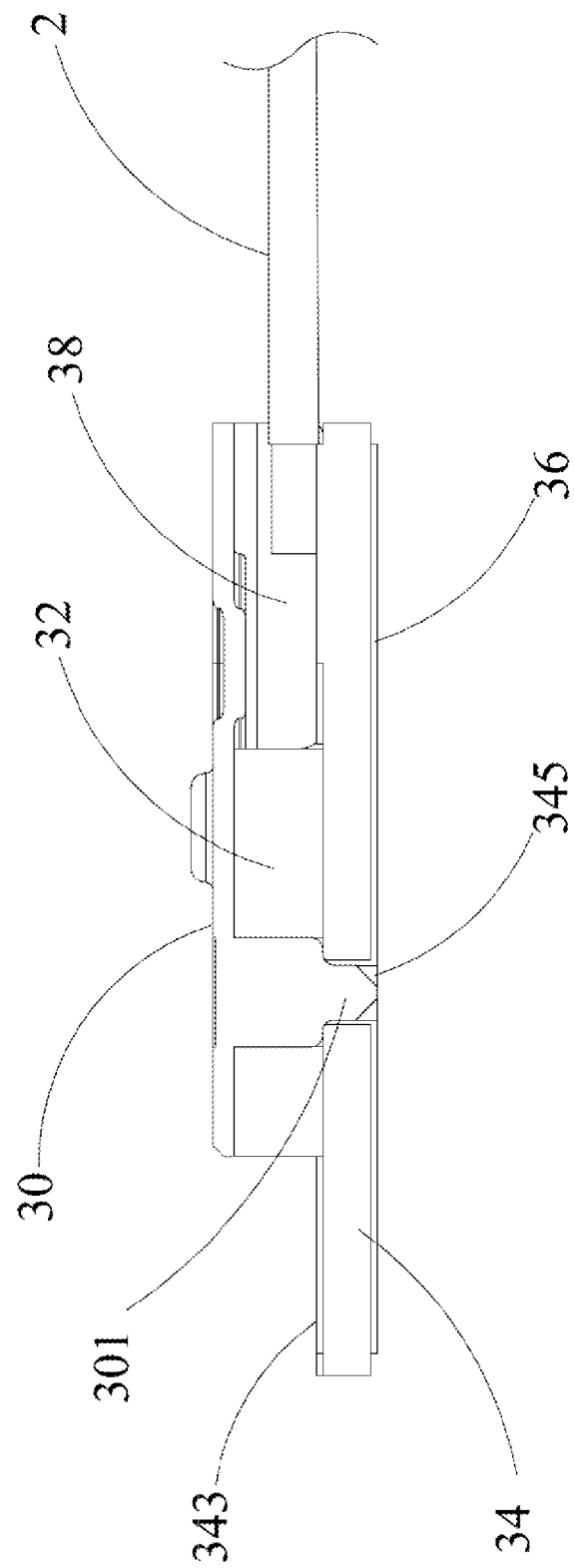
FIG. 10 is a schematic sectional view according to the plane B-B of the electrical connector of FIG. 6.

Referring to FIGS. 6 to 10, the second embodiment of the present invention provides another electrical connector. The electrical connector 3 comprises a first housing 30, an insulating body 32 and a circuit board 34. The insulating body 32 is disposed between the first housing 30 and the circuit board 34. The circuit board 34 has a butt portion 341 and a lap portion 342. The butt portion 341 is formed thereon with a plurality of first contacts 343. The lap portion 342 is formed thereon with a plurality of second contacts 344. Since the structures and functions of the first contacts 343 and second contacts 344 are the same as those of the aforementioned embodiment, the detailed description thereof will be omitted.

In this embodiment, the circuit board 34 is a rigid printed circuit board (PCB). The circuit board 34 is provided with a plurality of through holes 345. The first housing 30 is provided thereon with a plurality of engaging portions 301. The engaging portions 301 are engaged with the through holes 345 to mount the circuit board 34 on the first housing 30. A metal layer 36 is disposed on the bottom surface of the circuit board 34. The metal layer 36 extends into the through holes 345 and over a portion of the top surface of the circuit board 34 to contact the engaging portions 301. Thus, the effect of protecting against electromagnetic interference (EMI) can be achieved and the design of an iron housing can be eliminated. In this embodiment, the metal layer 36 is a copper electroplated layer, which can be coated along the through holes 345 into the side walls of the through holes 345 and over a portion of the top surface of the circuit board 34. Furthermore, in order that the circuit board 34 can be more firmly held on the first housing 30, the engaging portions 301 can be securely welded into the through holes 345 by welding. The insulating body 32 is positioned between the first housing 30 and the circuit board 34 so that the insulating body 32 is provided thereon with a plurality of opening 321 at least corresponding to a part of the engaging portions 301.

A containing space 38 is formed among the insulating body 32, the first housing 30, and the circuit board 34. The second contacts 344 are positioned in the containing space 38. The plurality of conducting wires 2 are securely soldered respectively to the second contacts 344 such that the conducting wires 2 are electrically connected to the second contacts 344. The conducting wires 2 are positioned in the containing space 38.

Alternatively, the circuit board 34 can also be a flexible printed circuit board. In order to increase the strength and thickness of the circuit board for connecting to a butt connector, a second housing (not shown in drawings) can be additionally disposed on the flexible printed circuit board, and a latching interference connection can be provided between the second housing and the first housing 30.

Figure 11:
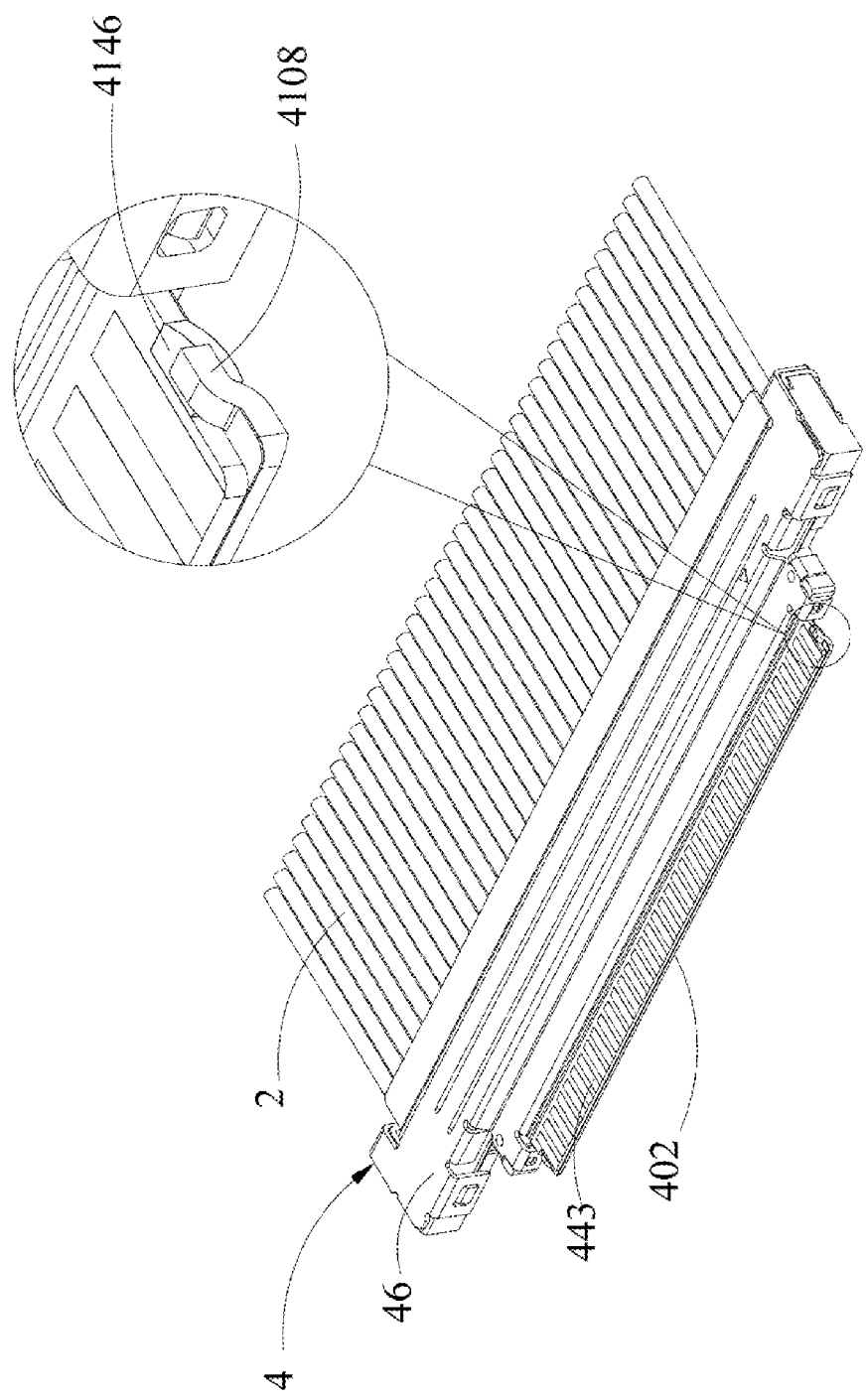
FIG. 11 is a schematic three-dimensional view of the assembly of an electrical connector according to the third embodiment of the present invention.
Figure 12:
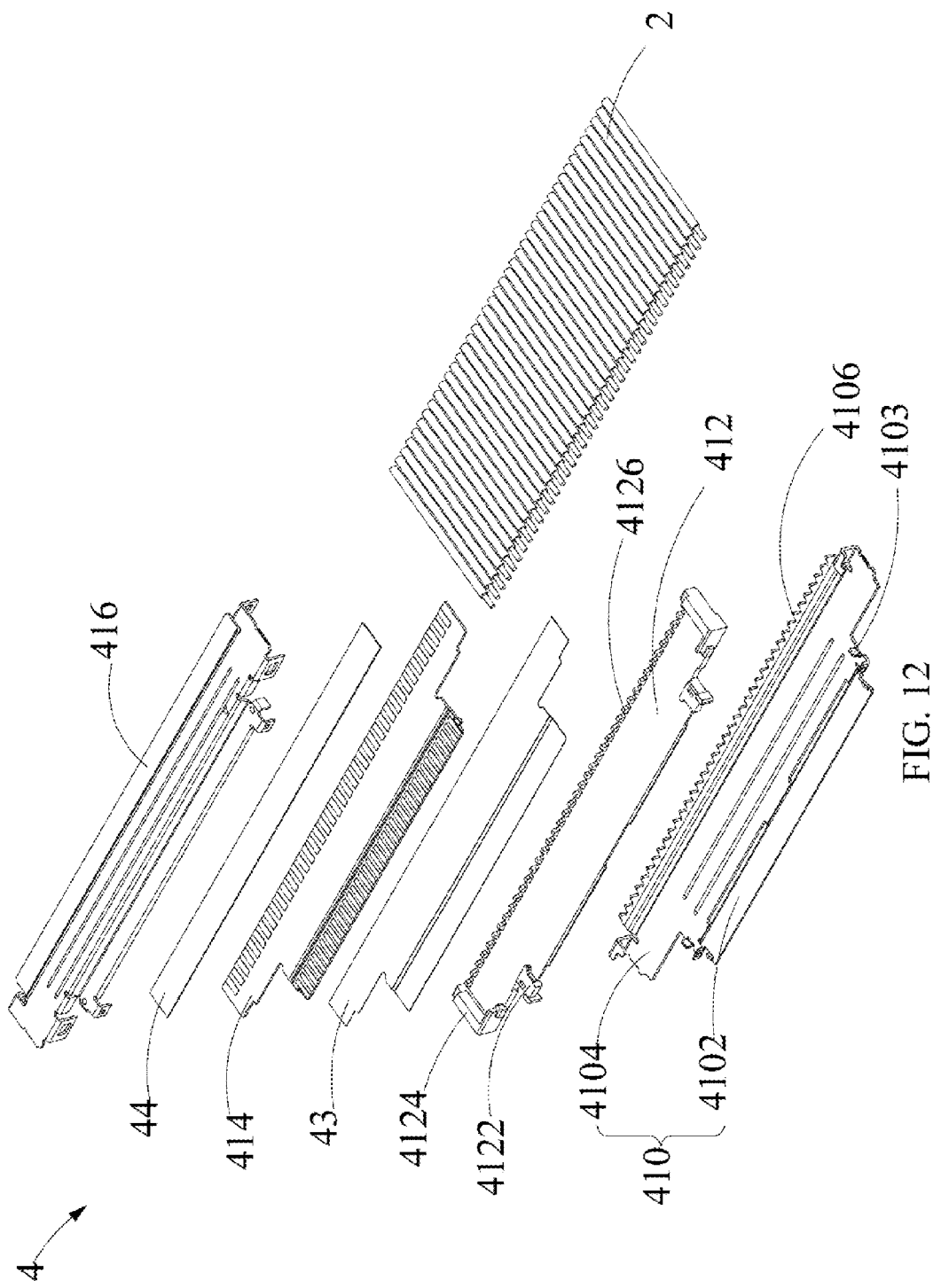
FIG. 12 is a schematic three-dimensional exploded view of an electrical connector according to the third embodiment of the present invention.
Figure 13:
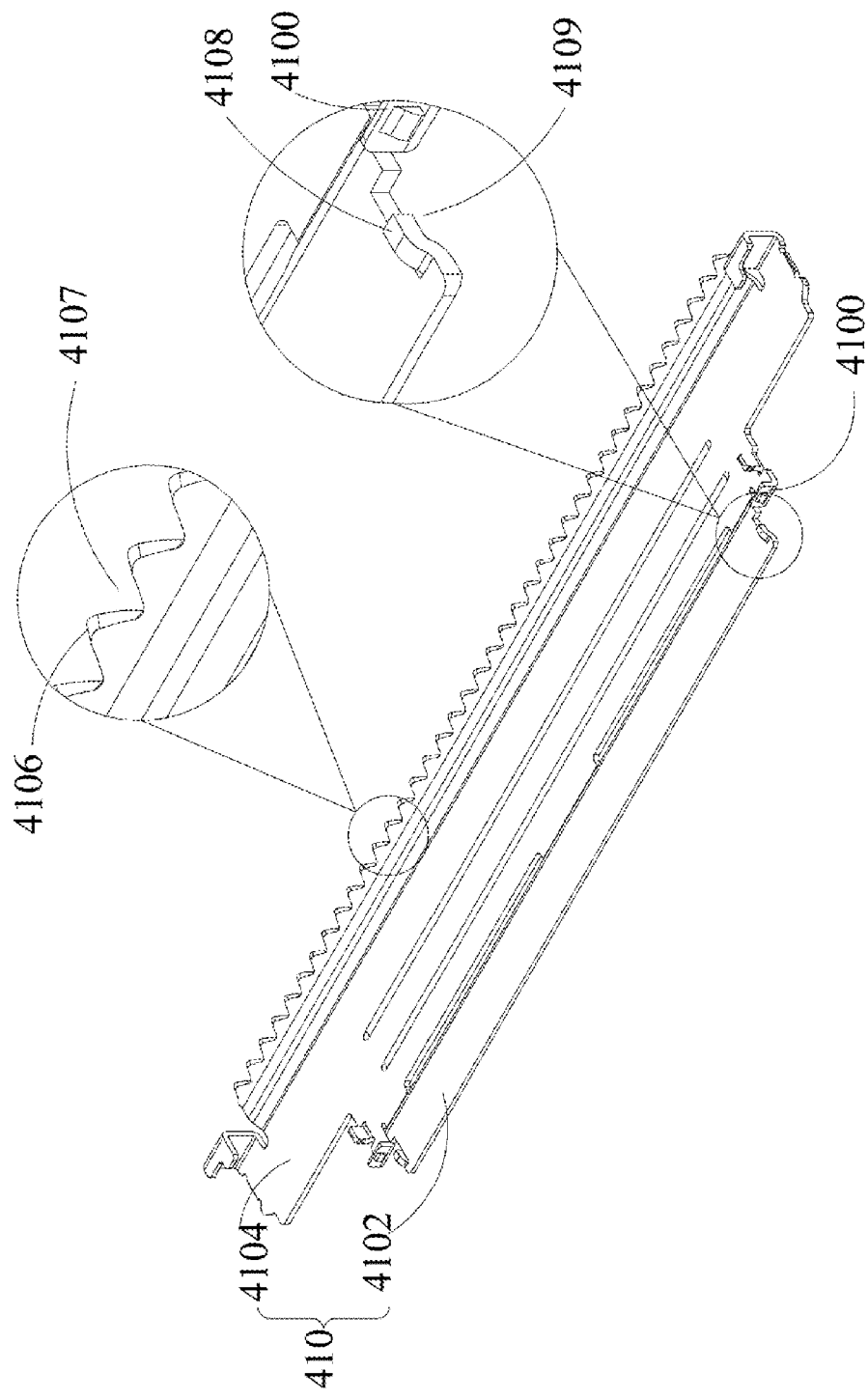
FIG. 13 is a schematic enlarged three-dimensional view of the first housing of FIG. 12.
Figure 14:
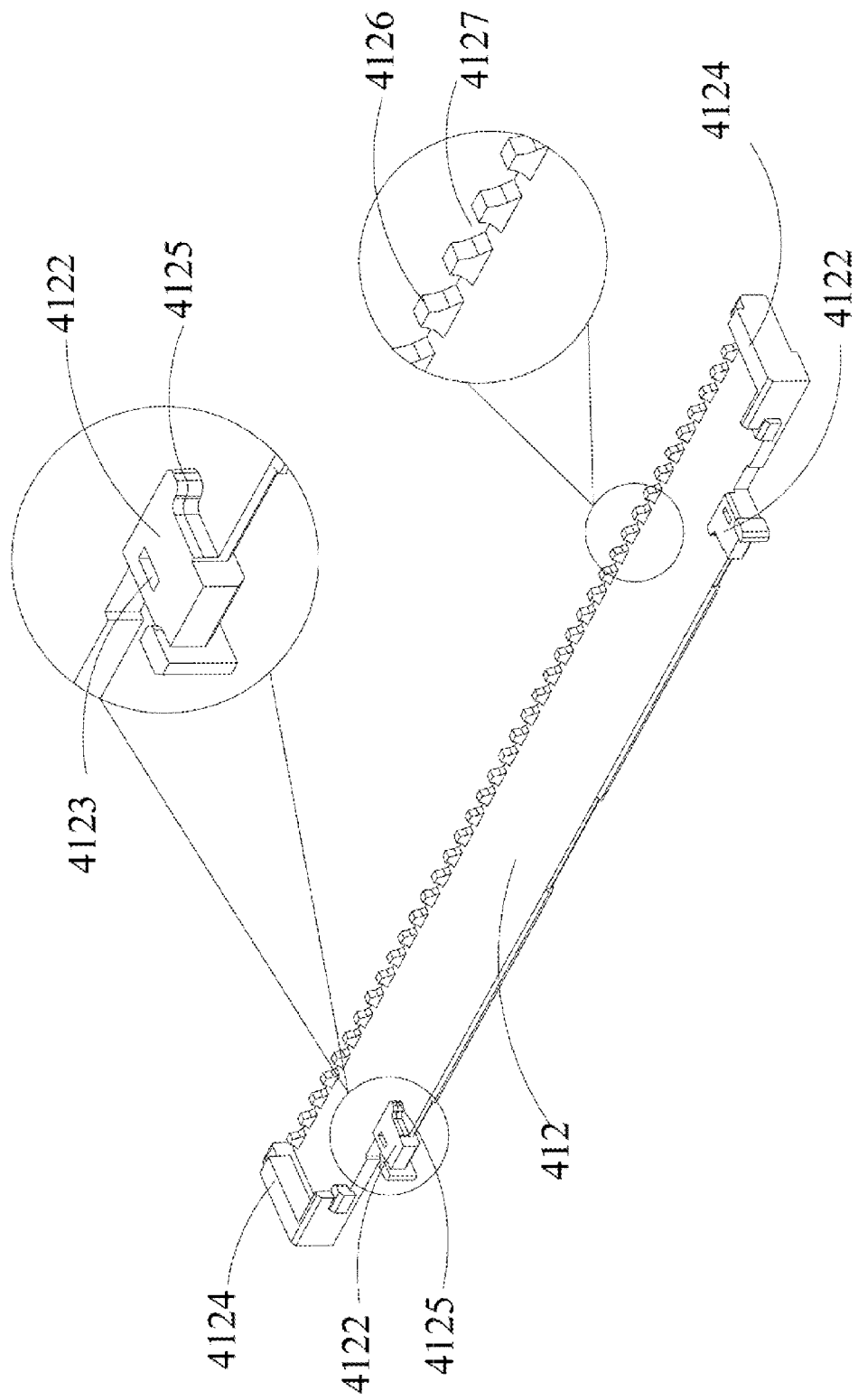
FIG. 14 is a schematic enlarged three-dimensional view of the insulating body of FIG. 12.
Figure 15:
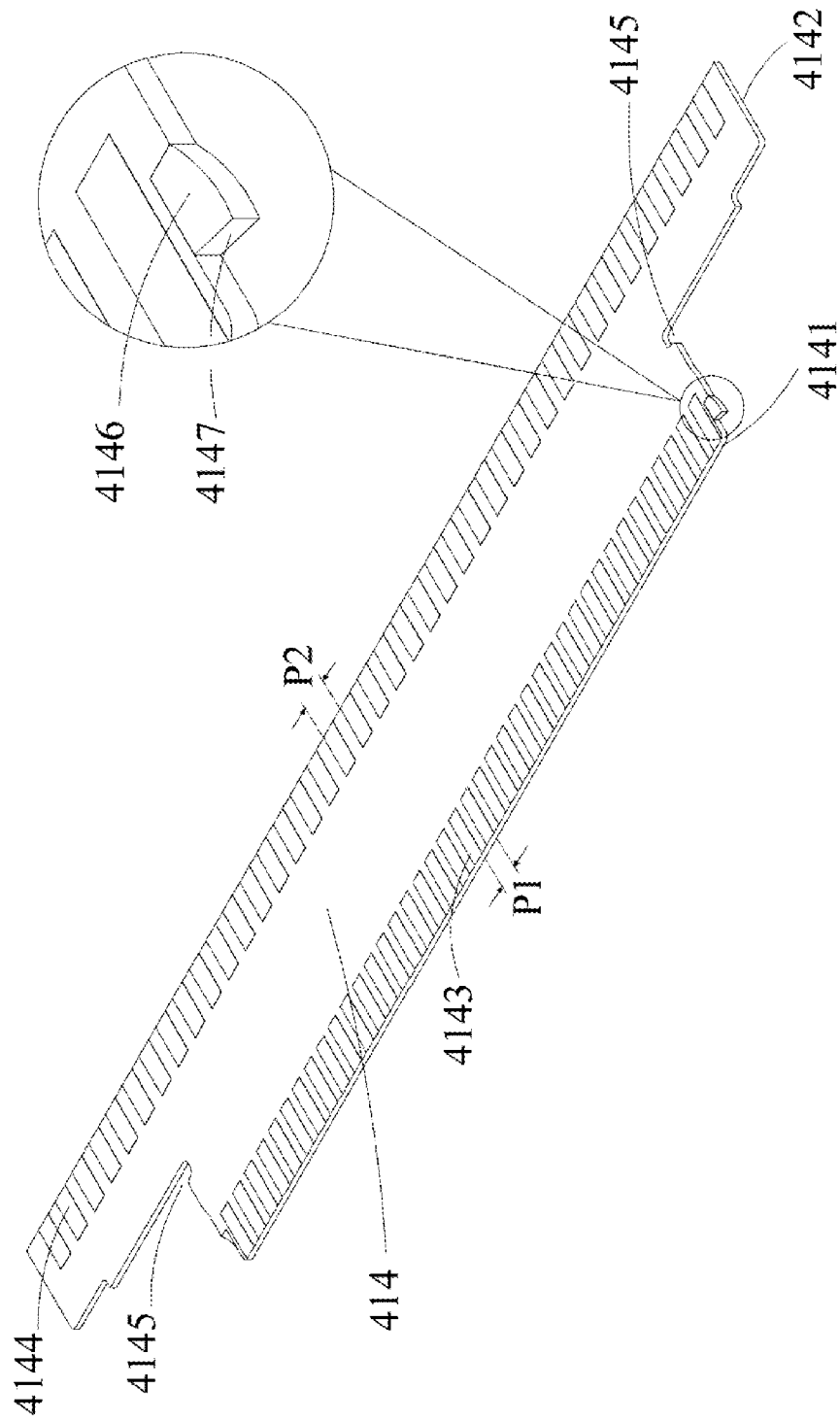
FIG. 15 is a schematic enlarged three-dimensional view of the circuit board of FIG. 12.
Figure 16:
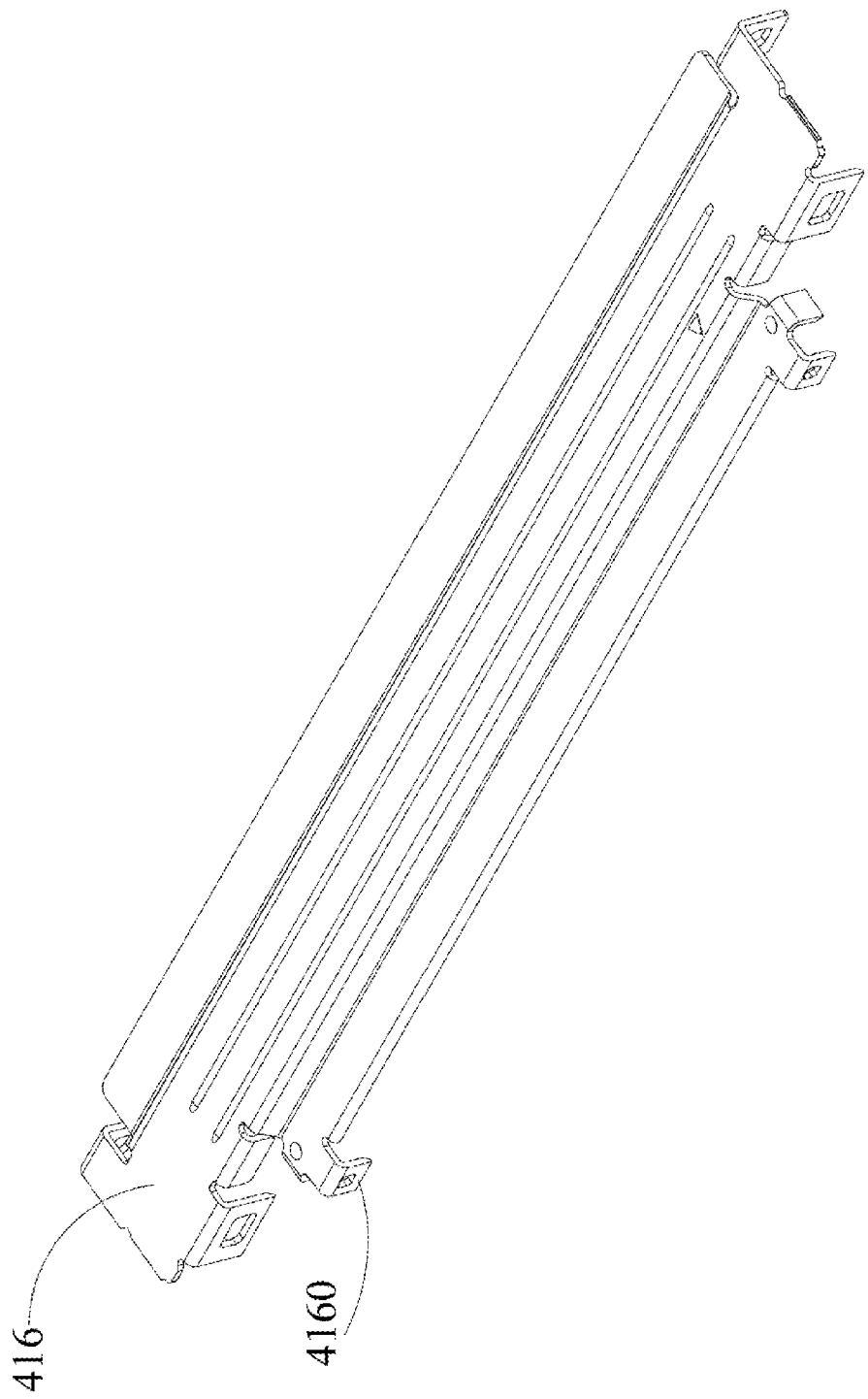
FIG. 16 is a schematic enlarged three-dimensional view of the second housing of FIG. 12.

Referring to FIGS. 11 to 16, the third embodiment of the present invention provides another electrical connector. The electrical connector 4 comprises a lower housing 410, an insulating body 412, a circuit board 414 and an upper housing 416. The lower housing 410 has a protruding portion 4102 and a bearing portion 4104. The insulating body 412 is disposed on the bearing portion 4104 of the lower housing 410. A positioning piece 4122 is disposed on each of both the left and right sides of the front half of the insulating body 412. A supporting piece 4124 is disposed on each of both the left and right sides of the rear half of the insulating body 412.

The circuit board 414 is disposed on the insulating body 412 and the lower housing 410. The circuit board 414 has a butt portion 4141 and a lap portion 4142 respectively at the front and rear ends thereof. The butt portion 4141 is disposed on the protruding portion 4102 of the lower housing 410. The lap portion 4142 is disposed on the insulating body 412. The butt portion 4141 is formed thereon with a plurality of first contacts 4143. The lap portion 4142 is formed thereon with a plurality of second contacts 4144. The first contacts 4143 and the second contacts 4144 are connected with each other. The first contacts 4143 and the second contacts 4144 can be sequentially correspondingly connected with each other according to their corresponding positions, or alternatively, can be jump-connected with each other not according to their corresponding positions. The second spacing P2 between the adjacent second contacts 4144 is larger than the first spacing P1 between the adjacent first contacts 4143. The first contacts 4143 are positioned on the protruding portion 4102 of the lower housing 410. The second contacts 4144 are positioned on the insulating body 412. The first contacts 4143 are arranged to couple to a butt connector (not shown in drawings). The upper housing 416 is positioned above the circuit board 414. In this embodiment, the second contacts 4144 are arranged to be coupled to a plurality of conducting wires 2, but not limited thereto, or can be connected to a flexible transmission element, such as a flexible flat cable. Furthermore, in this embodiment, the circuit board 414 is a flexible circuit board, such as a flexible printed circuit (FPC) board, but not limited thereto. Other circuit-mounted boards, such as rigid circuit boards and the like, can also be used in the present invention.

In order to avoid the warpage which occurs when the butt portion 4141 of the circuit board 414 disposed on the protruding portion 4102 is inserted and connected to a butt connector, an engaging mechanism can be provided between the butt portion 4141 and the protruding portion 4102 to fix the circuit board 414 on the lower housing 410. In this embodiment, the protruding portion 4102 is provided thereon with first engaging portions 4108. The butt portion 4141 of the circuit board 414 is provided thereon with second engaging portions 4146. The second engaging portions 4146 can engage with the first engaging portions 4108 to form the engaging mechanism, and thus the circuit board 414 can be firmly held on the lower housing 410. It should be noted that the opening portions 4109 of the first engaging portions 4108 face toward the insert portions 4147 of the second engaging portions 4146. Namely, the opening portions 4109 of the first engaging portions 4108 are back toward the butt connector. Thus, when the butt portion 4141 is inserted and connected to the butt connector, it is protected by the first engaging portions 4108 so that the problem of warpage of the butt portion 4141 of the circuit board 414 does not easily occur.

A fastening portion 4145 is disposed on each of both the left and right sides of the circuit board 414. The positioning pieces 4122 of the insulating body 412 can fasten the fastening portions 4145 so as to position the circuit board 414 at the corresponding position on the insulating body 412 and avoid disengagement of the circuit board 414 which is pulled by an external transverse force out of the insulating body 412. In this embodiment, two protrusions 4125 extend from the two respective positioning pieces 4122, and face toward each other. The fastening portion 4145 is a notch. The protrusions 4125 can be fastened on the notch. The protruding direction of the protrusion 4145 is just mutually perpendicular to the disengagement direction of the circuit board 414 which is easily pulled by a force so that a better effect of avoiding disengagement of the circuit board 414 can be achieved.

In this embodiment, the positioning pieces 4122 have the function of fixing the lower housing 410 to the insulating body 412, besides the function of positioning and retaining the circuit board 414. The lower housing 410 has an engaging portion 4103. The positioning piece 4122 of the insulating body 412 is provided with an opening 4123. The engaging portion 4103 is inserted into the opening 4123 to fix the lower housing 410 on the insulating body 412, while the upper housing 416 is disposed on the positioning pieces 4122 and positioned above the circuit board 414. The lower housing 410 is provided thereon with a first latching portion 4100. The upper housing 416 is provided thereon with a second latching portion 4160. The first latching portions 4100 can be latched with the second latching portions 4160 to fixedly dispose the upper housing 416 on the insulating body 412 and the lower housing 410.

In this embodiment, the first latching portion 4100 is provided thereon with a convex, and the second latching portions 4160 is provided thereon with a hole. The convex can be engaged with the hole such that the first latching portion 4100 is latched with the second latching portions 4160. The circuit board 414 and the insulating body 412 are assembled into the electrical connector 4. It should be noted that the first latching portion 4100 and the second latching portion 4160 are just propped against a side wall of the positioning piece 4122. As a result, the strength and supporting force at the latching connection between the first latching portion 4100 and the second latching portion 4160 can be increased by the influence of the positioning piece 4122. Particularly, when the latching connection and the butt connector are propped against each other as the electrical connector 4 in this embodiment, the supporting action of the positioning pieces 4122 is more required to extend the service life of the latching connection.

Furthermore, a supporting piece 4124 is disposed on each of both the left and right sides of the rear half of the insulating body 412. The supporting pieces 4124 are adapted to support the upper housing 416 such that a containing space 418 is formed among the upper housing 416, the insulating body 412, and the circuit board 414. The second contacts 4144 are positioned in the containing space 418. The plurality of conducting wires 2 are securely soldered respectively to the second contacts 4144 such that the conducting wires 2 are electrically connected to the second contacts 4144. One ends of the conducting wires 2 are positioned in the containing space 418. It should be noted that the butt portion 4141 and the first contacts 4143 of the printed circuit board 414 extend out of the first housing 410. Thus, the butt portion 4141, the first contacts 4143 of the circuit board 414 and the protruding portion 4102 of the lower housing 410 can form a butt joint for low voltage differential signaling (LVDS). In this embodiment, a plurality of first convex portions 4126 are further formed on the rear half of the insulating body 412. A plurality of first slots 4127 are formed between every adjacent two first convex portions 4126. Each of the first slots 4127 is just adapted to accommodate one of the conducting wires 2. Moreover, in this embodiment, a plurality of second convex portions 4106 are further formed at the rear side of the bearing portion 4104 of the lower housing 410. A plurality of second slots 4107 are formed between every adjacent two second convex portions 4106. Each of the second slots 4107 is adapted to accommodate one of the conducting wires 2. The second slots 4107 are disposed corresponding to the first slots 4127. Thus, when the plurality of conducting wires 2 are securely soldered respectively to the second contacts 4144 of the circuit board 414, the second slots 4107 formed by the plurality of second convex portions 4106 of the lower housing 410 and the first slots 4127 formed by the plurality of first convex portions 4126 of the insulating body 412 can form a fixing structure for fixing the plurality of conducting wires 2 on the electrical connector 1. Alternatively, the upper housing 416 may be formed thereon with a zigzag or wavy structure similar to the pattern of the plurality of second convex portions 4106 and second slots 4107. Hence, the detailed description thereof will be omitted.

Moreover, in order to achieve the grounding effect between the conducting wires 2 and the upper housing 416, a ground bar (not shown in drawings) is generally disposed on these conducting wires 2. The ground bar is positioned at the rear of the first convex portions 4126, compared to which the circuit board 414 is positioned at the front of the first convex portions 4126 of the insulating body 412. When the conducting wires 2 are securely soldered to the second contacts 4144 of the circuit board 414, the first convex portions 4126 can prevent solder from flowing from the second contacts 4144 through the first slots 4127 to the ground bar and thereby avoid a short circuit. The plurality of first convex portions 4126 on the insulating body 412 also have the function similar to that of the positioning pieces 4122 for positioning and retaining the circuit board 414. Therefore, the plurality of first convex portions 4126 on the insulating body 412 can prevent solder overflow which occurs when the conducting wires 2 are securely soldered to the circuit board 414, besides having the function of positioning the circuit board 414 and the conducting wires 2.

In this embodiment, an insulating layer 44 is disposed between the upper housing 416 and the circuit board 414 so as to protect the soldering points between the conducting wires 2 and the circuit board 414 against short-circuiting. A bonding layer 43 is disposed between the circuit board 414 and the lower housing 410, the insulating body 412, so as to attach the circuit board 414 to the lower housing 410 and the insulating body 412. In this embodiment, the bonding layer 43 is a double-sided adhesive tape, and the circuit board 414 is a flexible printed circuit (FPC) board. In order to increase the strength and thickness of the circuit board 414 when connected to a butt connector, the butt portion 4141 of the circuit board 414 is disposed on the protruding portion 4102 of the lower housing 410 and the lap portion 4142 of the circuit board 414 is disposed on insulating body 412.

As concluded from the above, the electrical connector of the present invention adopts the design of a spacing between the adjacent contacts on the front end of a printed circuit board different from that between the adjacent contacts on the rear end of the printed circuit board to achieve that the spacing between the adjacent contacts on the male lap end is larger than the spacing between the adjacent contacts on the butt end. Thus, when the signal transmission lines are securely soldered to the lap end, the situations of poor soldering and short circuiting do not readily occur, and can effectively solve the problems of reduced production yields, increased production time and costs of LVDS type male connectors. Moreover, the electrical connector of the present invention can be electrically conductive with the upper iron housing by the application of copper on the lower surface of a rigid printed circuit board, thereby providing protection against electromagnetic interference and eliminating the design and cost of lower iron housing. Furthermore, the design of a housing is used to substitute for a plastic core in the electrical connector of the present invention. Thus, not only can the electrical connector meet the requirements for electrical connector thinning, but the use of plastic cores and the costs of electrical connector production can also be reduced. Additionally, the insulating body of the electrical connector of the present invention is provided thereon with two positioning pieces, a plurality of first convex portions and first slots. This can effectively retain the circuit board and fasten the conducting wires, thus capable of avoiding disengagement of the circuit board and conducting wires which are readily pulled by an external force out of the electrical connector.

The foregoing description and drawings show only preferred embodiments of the present invention, and these embodiments however are not intended to limit the present invention. Various modifications or changes can be made without departing from the spirit and scope of the invention. All such equivalent modifications and changes shall be included within the scope of the appended claims.

What is claimed is:

1. An electrical connector comprising:
   a circuit board having a butt portion and a lap portion, said butt portion formed thereon with a plurality of first contacts, said lap portion formed thereon with a plurality of second contacts, said first contacts and said second contacts connecting with each other, a second spacing between said adjacent second contacts being larger than a first spacing between said adjacent first contacts, and said first contacts being arranged to couple to a butt connector;
   a first housing assembled on said circuit board and positioned above said lap portion;
   a plurality of conducting wires being securely soldered respectively to said second contacts such that said conducting wires being electrically connected to said second contacts; and
   a ground bar disposed on said conducting wires and being in contact with a spring sheet of said first housing.

2. The electrical connector as claimed in claim 1, further comprising:
   an insulating body disposed between said first housing and said circuit board.

3. The electrical connector as claimed in claim 1 further comprising:
   a second housing disposed under said circuit board.

4. The electrical connector as claimed in claim 1, wherein said butt portion and said first contacts extend out of said first housing.

5. The electrical connector as claimed in claim 1, wherein said first housing has a support portion for supporting said first housing.

6. The electrical connector as claimed in claim 5, wherein said support portion is disposed on said circuit board.

7. The electrical connector as claimed in claim 1, wherein said circuit board is provided with a plurality of through holes, said first housing is provided with a plurality of engaging portions, and said engaging portions engage with said through holes.

8. The electrical connector as claimed in claim 7, further comprising:
a metal layer disposed under said circuit board and being in contact with said engaging portions.

9. An electrical connector comprising:
a lower housing having a protruding portion and a bearing portion;
an insulating body disposed on said bearing portion of said lower housing;
a circuit board disposed on said insulating body and said lower housing, said circuit board having a butt portion and a lap portion thereon, said butt portion disposed on said protruding portion of said lower housing, said lap portion disposed on said insulating body, said butt, portion formed thereon with a plurality of first contacts, said lap portion formed thereon with a plurality of second contacts, said first contacts and said second contacts connected with each other, a second spacing between said adjacent second contacts being larger than a first spacing between said adjacent first contacts, and said first contacts being arranged to couple to a butt connector; and
an upper housing positioned above said circuit board.

10. The electrical connector as claimed in claim 9, wherein said upper housing is disposed on said insulating body.

11. The electrical connector as claimed in claim 9, further comprising:
a plurality of conducting wires being securely soldered respectively to said second contacts such that said conducting wires being electrically connected to said second contacts.

12. The electrical connector as claimed in claim 9, wherein a plurality of first convex portions are formed on a rear half of said insulating body.

13. The electrical connector as claimed in claim 9, wherein a positioning piece is disposed on each of both left and right sides of a front half of said insulating body, a fastening portion is disposed on each of said left and right sides of said circuit board, and said fastening portion is fastened on said positioning piece of said insulating body.

14. The electrical connector as claimed in claim 13, wherein said upper housing is disposed on said positioning pieces on said left and right sides of said front half of said insulating body.

15. The electrical connector as claimed in claim 13, wherein said lower housing is provided thereon with a first latching portion, said upper housing is provided thereon with a second latching portion, said first latching portion is latched with said second latching portion to fix said upper housing on said insulating body, and said first latching portion and said second latching portion are propped against a side wall of said positioning piece.

16. The electrical connector as claimed in claim 13, wherein a protrusion extends from said positioning piece, said fastening portion is a notch, said notch is fastened on said protrusion, and protruding direction of said protrusion is mutually perpendicular to disengagement direction of said circuit board which is pulled by a force.

17. The electrical connector as claimed in claim 9, wherein a plurality of first slots are formed on a rear half of said insulating body and said first slots are adapted to accommodate said conducting wires.

18. The electrical connector as claimed in claim 17, wherein a plurality of second slots are formed at said rear side of said bearing portion of said lower housing, said second slots are adapted to accommodate said conducting wires, and said second slots are disposed corresponding to said first slots.

* * * * *